United States Patent [19]

Alonso

[11] Patent Number: 4,726,067

[45] Date of Patent: Feb. 16, 1988

[54] METHOD OF AND APPARATUS FOR EXTENDING THE USEFUL DYNAMIC RANGE OF DIGITAL-AUDIO SYSTEMS

[75] Inventor: Sydney A. Alonso, Norwich, Vt.

[73] Assignee: New England Digital Corporation, White River Junction, Vt.

[21] Appl. No.: 926,737

[22] Filed: Nov. 4, 1986

[51] Int. Cl.$^4$ ............................................... H03G 7/00
[52] U.S. Cl. ........................................ 381/106; 360/32; 84/1.27
[58] Field of Search ............................ 381/63, 61, 106; 84/1.27, 1.24, DIG. 26; 360/32; 333/14

[56] References Cited

U.S. PATENT DOCUMENTS

| | | | |
|---|---|---|---|
| 4,205,575 | 6/1980 | Hoskinson et al. | 84/1.27 |
| 4,348,929 | 9/1982 | Gallitzendorfer | 84/1.24 |
| 4,649,564 | 3/1987 | Brnett | 381/63 |

*Primary Examiner*—Forester W. Isen
*Attorney, Agent, or Firm*—Robert Shaw

[57] ABSTRACT

A method of (and apparatus for) extending the useful dynamic range of an audio reproduction system. An input acoustic signal in the audible range is transduced to form an analog electric signal which is amplified along parallel paths to gain levels $g_1$ and $g_2$ (where $g_2 > g_1$), the amplified signals being sampled to provide two binary digital signals. The analog signal consists of a high amplitude portion and a low amplitude portion. The two binary digital signals are processed by a computer which provides a first binary output and a second binary output, the first binary output being a digital representation of the sequential samples of the audio signal taken at the respective gain setting $g_1$ or $g_2$. More precisely, the first binary digital output is a composite binary digital waveform consisting of a high amplitude portion at gain setting $g_1$, a low amplitude portion at gain setting $g_2$ and a transition or cross-fade portion therebetween. The second binary output is a digital representation of the output gain required to normalize the effect of the particular input gain setting $g_1$ or $g_2$ on the final output such that the product of input gain and output gain remains constant. The second binary output signal is fed to an interpolator, then converted to analog and connected as an analog signal to a multiplying D/A which receives, also, the first binary digital output. The multiplying D/A provides an output analog signal derived initially from the high amplitude input portion which was amplified to gain $g_1$, followed by the low amplitude input portion which was amplified to gain $g_2$, the transition or cross-fade portion therebetween being a blend of the two and the gain thereof being modified as it is blended.

7 Claims, 7 Drawing Figures

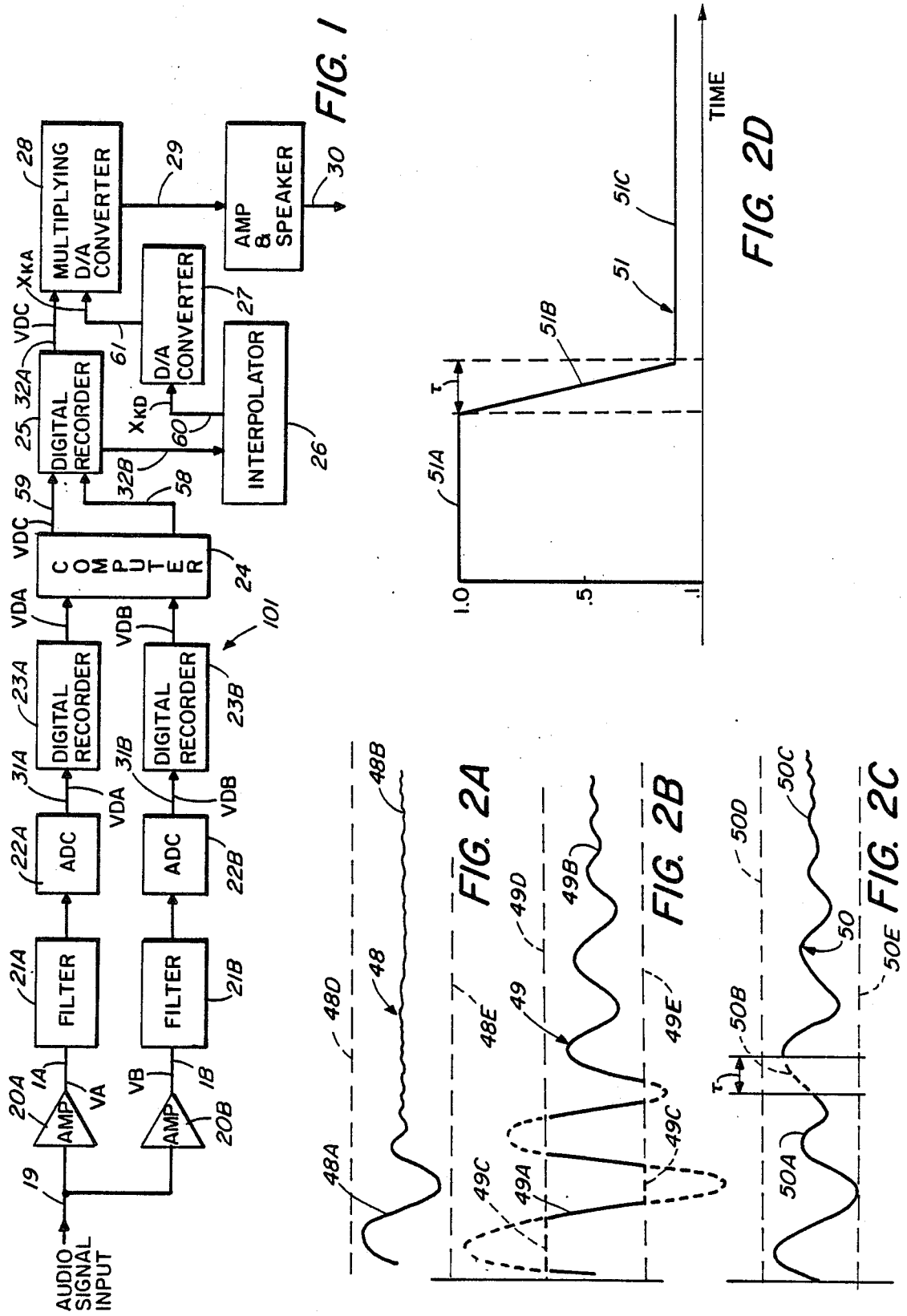

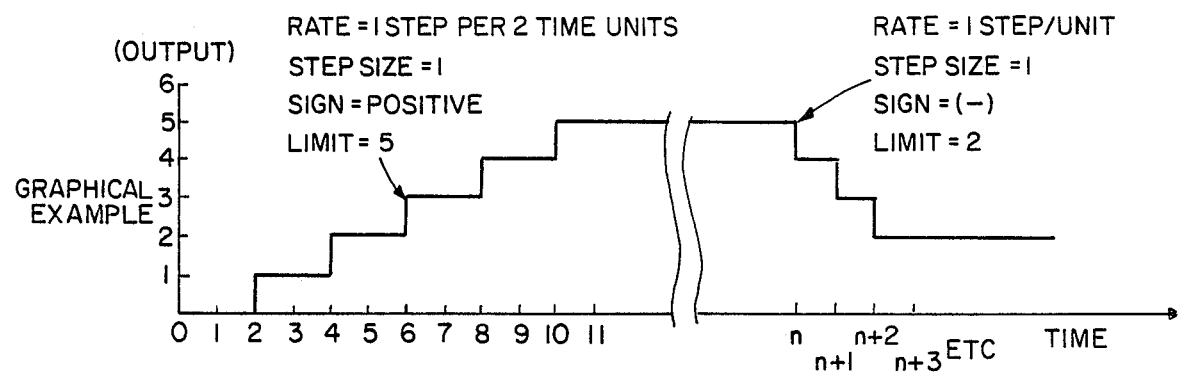
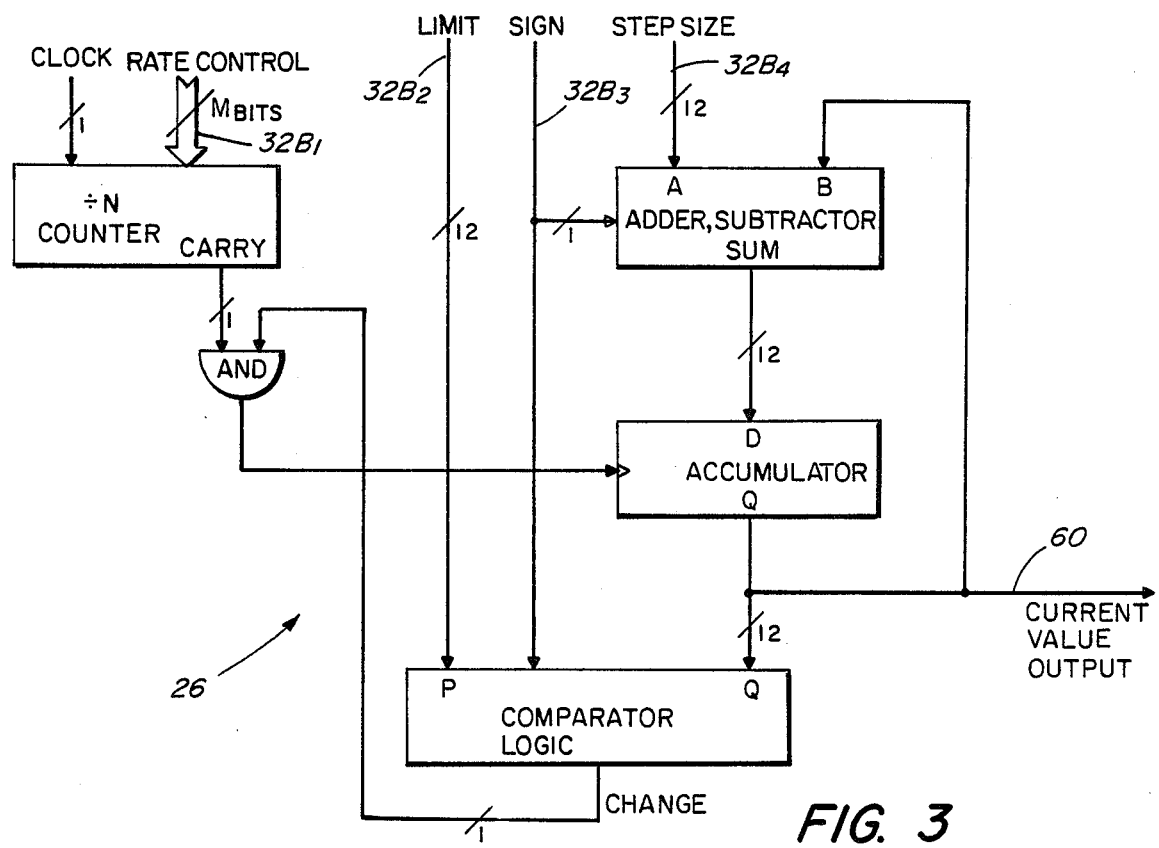

METHOD OF AND APPARATUS FOR EXTENDING THE USEFUL DYNAMIC RANGE OF DIGITAL-AUDIO SYSTEMS

The present invention relates to a system that is operable to extend the range of undistorted audible sound in a digital recording system.

Attention is called to U.S. Pat. Nos. 4,345,500 (Alonso et al.), 4,554,855 (Alonso et al.), and the further patents cited therein as background for the present specification.

Often in an audio recording process a certain ambience present in a live performance is lost during processing. At least one reason for the loss is that the tail or final portion of an acoustic vibration which is very low in amplitude is distorted and attenuated within the sound recording and/or reproduction system.

It is an objective of the present invention to provide an audio recording and reproduction system with extended useful range.

This and still further objectives are addressed hereinafter.

The foregoing objects are attained, generally, in a method of (and apparatus for) extending the useful dynamic range of an audio reproduction system that is operable to provide an output audio signal in the form of a composite output audio signal that includes a high amplitude portion followed by a low amplitude portion with a transition or cross-fade portion therebetween, which method includes the steps of: providing an analog electrical representation of an audio signal; dividing the analog electrical representation into two analog signals and directing the two analog signals along two parallel paths, each of the two analog signals having a high amplitude portion and a low amplitude portion; maintaining one analog signal of the two analog signals at a normal gain setting $g_1$ and amplifying the second analog signal to an abnormal gain setting $g_2$ (where $g_2 >> g_1$); converting the two analog signals to respective binary digital signals; processing the binary digital signals in a computer adapted to provide a first binary output and a second binary output, the first binary output being a composite digital representation of sequential samples of the audio signal taken at a respective input gain setting $g_1$ or $g_2$ and the second binary output being a digital representation of the output gain required to normalize the effect of the respective input gain setting on the final output so that the product of the respective input gain and the output gain remain constant; providing an audio output signal from the composite digital representation, the audio output signal being a composite signal that includes an output derived from the one analog signal during the high amplitude portion and an output derived from the second analog signal during the low output portion of the audio signal, the transition or cross-fade portion being a composite or blended signal that includes in part an output audio signal derived from the one analog signal and in part an output audio signal derived from the second analog signal; during the transition or cross-fade portion, blending the contribution by the one analog signal and the second analog signal, the contribution of the one analog signal to the output audio signal being initially dominant and the contribution of the second analog signal being insignificant, the mixture of the one analog signal and the second analog signal being changed such that the contribution of the one analog signal to the output analog signal is decreased and the contribution of the second analog signal to the output audio signal is increased to provide a smooth transition between the high amplitude portion and the low amplitude portion; and, during the transition or cross-fade portion, decreasing the overall output gain from a level that is consistent with the one analog signal to a lower level that is consistent with the second analog signal. During the transition or cross-fade time, the overall output gain must be smoothly reduced between the normal output gain (initially) and the abnormal output gain (ultimately); that is, the output gain must be reduced smoothly and inversely between the normal input gain $g_1$ applied to the first input analog signal (i.,e., normal gain) and the abnormal input gain $g_2$ applied to the second input analog signal (i.e., abnormal gain). In the example herein, the normal gain is one and the abnormal gain is ten. Hence, in the transition or cross-fade region, the gain applied to the output signal varies from some determined gain to a gain that is one tenth the level of the determined gain in this example.

The invention is hereinafter discussed with reference to the accompanying drawing in which:

FIG. 1 is a diagrammatic representation of a digital-audio recording and reproduction system which produces an audio output with an extended useful dynamic range;

FIG. 2A shows an input acoustic waveform that has been amplified to a first or normal gain setting ($g_1$), the waveform tailing down from an initial high amplitude to a final, very low amplitude;

FIG. 2B shows the same input acoustic waveform except that has been amplified to a second or abnormal level ($g_2$), the waveform tailing down from an initial high amplitude to a final, very low amplitude;

FIG. 2C shows a smooth version of a digital composite waveform whose initial portion is derived from the waveform in FIG. 2A, whose tail or final portion is derived from the waveform in FIG. 2B and whose intermediate portion is a combination;

FIG. 2D is a curve of the reverse weighted average of the gains applied to input acoustic waveforms in FIGS. 2A and 2B and represent the gain needed to match or blend the initial portion of the waveform in FIG. 2A with the ultimate portion of the waveform in FIG. 2B to achieve an output representative of the input to the system of FIG. 1;

FIG. 3 is a diagrammatic representation of the block labeled "interpolator" in FIG. 1, which interpolator serves to control volume of a composite signal within the system of FIG. 1 to produce the audio output with its extended dynamic range; and FIG. 4 is a graphic example of the output of the interpolator.

Turning to the figures, the function of the apparatus labeled 101 in FIG. 1 is to provide an audio output (that is, an acoustic output in the audible frequency range) at 30 derived from an analog electric signal at 29, the signal at 29 being like the analog signal 48 in FIG. 2A. It is the function of the apparatus 101 to take an electrical representation of an audio signal as input at 19 and to process that electrical representation of the audio signal to provide a signal VDC at 32A (and at 59) which is a composite digital signal consisting of an initial or high amplitude portion 50A, an intermediate or transition or cross-fade portion 50B and a tail or final portion 50C. It is shown later that the initial or high amplitude portion 50A is derived from the initial or high amplitude portion 48A of the signal marked 48 in FIG. 2A, the final or low amplitude portion 50C is derived from the final or tail portion 49B of a signal 49 in FIG. 2B, and the intermediate portion 50B (which exists for a time period $\tau_\eta$) is a composite or blend which is partly derived from the signal 48 or from the signal 49, that is, a composite or combination composed partly of the signal 48 and partly of the signal 49, as later discussed. (It should be pointed out, as above indicated, that the waveform in FIG. 2C is a "smooth version" of the digital composite waveform at 32A and 59.) The signal at 32A is processed at 28, as later discussed, to provide an output like the analog signal 48.

The signal input 19, as noted, is an analog electrical signal which is representative of an audio input signal. It is connected as input to a first gain controllable amplifier 20A as well as to a second gain controllable amplifier 20B whose amplified outputs 1A and 1B, respectively, are the signals 48 and 49, respectively (it must be noted here that the signals 48 and 49 represent the analog signal as 1A and 1B or a smooth version of digital signals at 31A and 31B). In FIGS. 2A, 2B, and 2C, the amplification levels designated 48D, 49D, and 50D are identical positive cut-off levels and the amplification levels designated 48E, 49E, and 50E are identical negative cut-off levels. While the waveform 48 is at all times between the cut-off levels, the waveform 49 is shown clipped at 49C in the front part or initial portion of the waveform. The apparatus 101 includes a first channel consisting of the amplifier 20A, a filter 21A, and so forth, and a second parallel channel consisting of the amplifier 20B, a filter 21B, and so forth. In this explanation the gain of the first amplifier 20A is termed a normal or first level of gain $g_1$ (which may be unity gain or a level of one) to give the signal 48 and the larger gain of the second amplifier 20B to give the signal 49 at what is termed an abnormal or second level of gain $g_2$. The second or abnormal level of gain $g_2$ is much greater (e.g., ten times) than the first or normal level of gain $g_1$. The filters 21A and 21B serve to permit sampling of the signals at 1A and 1B to eliminate aliasing (see Alonso U.S. Pat. No. 4,279,185 for a discussion of sampling and aliasing; see also U.S. Pat. No. 4,345,500) prior to further processing, as now discussed.

Two analog-to-digital converters (ADC) 22A and 22B are connected respectively to receive the first amplified signal 1A and the second amplified signal 1B; the ADC converters convert the received signals respectively to first and second binary digital signals at 31A and 31B (the designation 31A and 31B, like 1A and 1B, represent the signals, as well as the conductors carrying the signals, in this explanation). Two digital recorders 23A and 23B are connected to receive the first binary digital signal 31A and the second binary digital signal 31B, respectively, and provide two outputs representative thereof. Those outputs are inputs to a computer 24 whose function it is to evaluate inputs thereto and determine which of the signals 48 and 49, at any point in time, should be providing the signal at 29 in FIG. 1, as well as the transition from 50A to 50C in FIG. 2C. The computer provides two outputs 58 and 59 to a further digital recorder 25 whose outputs at 32A and 32B are respectively to a multiplying digital-to-analog (D/A) converter 28 and an interpolator 26. During the cross-fade portion the signal gain is smoothly reduced by the interpolator 26 from a level consistent with the gain $g_1$ of the signal 48 (e.g., unity) to that of the inverse gain $1/g_2$ of the signal 49 (e.g., a gain of ten) as now explained.

The signals labeled VDA, VDB and VDC as discussed herein are digital representations of the analog waveforms of the same, but smoother, shape shown at 48, 49 and 50, respectively. The curve labeled 51 in FIG. 2D has a level 51A representative of the gain used during the high amplitude portion 50A of the signal VDC and a level 51C representative of the inverse gain used during the low amplitude portion 50C of the signal VDC. The portion marked 51B is in the cross-fade portion 50B of FIG. 2C during time $\tau$. During time $\tau$, the interpolator 26 functions to provide a weighted average of contribution of wave energy of VDA and VDB to the signal VDC which appropriately shifts from the signal VDA at 51A to VDB at 51C, as explained below. The interpolator 26 is shown in detail in FIG. 3 where the input 32B is shown as four inputs $32B_1$, $32B_2$, $32B_3$ and $32B_4$. The figure is self-explanatory in the light of the further explanation herein.

The foregoing is orchestrated by the computer 24 which controls the mixture of VDA and VDB in the signal VDC. The computer notes when the abnormal gain signal VDB is within the range between 49D and 49E in FIG. 2B and commences to cross-fade, that is, to phase VDA out of and VDB into the signal VDC such that during the time period $\tau$ there is progressively less and less of the first signal VDA and more and more of the signal VDB in the signal VDC. As stated below the phasing in and out is done by taking N samples, the designation K representing any sample point within the N sample; X represents a gain setting, $X_K$ generally the gain setting of the sample K and $X_{KD}$ and $X_{KA}$ represent respectively digital and analog values of $X_K$. The input VDC to the multiplying D/A converter 28 is a digital representation of the sequential samples of the audio input signal 19 taken at the particular input gain setting of the signals at 1A and 1B and form the bases of the audio signal which will ultimately emit as an audio signal at 30 in FIG. 1; the gain of that audio signal is determined by the input marked 61 and $X_{KA}$ (which is an analog input) to the multiplying D/A converter 28. The way the signal $X_{KD}$ at 60 is generated is now addressed.

Switching from VDA to VDB according to the present teaching is effected over a finite time period $\tau$ in N steps to avoid abruptness and, hence, distortion of the output at 30. The wave shape of the output 30 is determined by the computer 24, but, as the computer fades VDB in the VDA out, the interpolator gradually changes the gain (g) from the level 51A ($g_1$) in FIG. 2D to the level 51C ($g_2$) along the line 51B. The interpolator 26 in FIG. 4 functions to synthesize an arbitrarily smooth digital representation of a straight line segment—like the line 51B—of controlled slope and limited length as a series of steps, as shown in FIG. 4.

The time $\tau$ in FIGS. 2C and 2D, as above noted, is termed the cross-fade area and is the region 50B of the signal 50 herein. In the cross-fade area the output signal 50 in FIG. 2C, as above indicated, changes from being the signal 48A (at 50A) to being the signal 49B (at 50C). There is a gradual shift at 50B from 48A to 49B as the source of the output signal 50. To be more specific, in the cross-fade area 50B, N samples of VDC are provided by the recorder 25 to the multiplying D/A converter 28 such that $$VDC_K = \frac{N-K}{N} \cdot VDA + \frac{K}{N} \cdot VDB, \text{ where}$$

VDC$_K$ is the Kth digital sample of the series of N samples provided during cross-fade portion and $1 \leq K \leq N$. The interpolator 26 provides N samples of X$_K$ such that $$X_K = \frac{N-K}{N} \cdot \frac{1}{g_1} + \frac{K}{N} \cdot \frac{1}{g_2}, \text{ where}$$

X$_K$ is the Kth digital sample of the series of N samples representing the output gain during the cross-fade portion and $1 \leq K \leq N$.

Modifications of the invention herein disclosed will occur to persons skilled in the art, and all such modifications are deemed to be within the scope of the invention as defined by the appended claims.

What is claimed is:

1. Apparatus for extending the useful dynamic range of a digital-audio recording and reproduction system, that comprises:
    gain control means comprising first and second gain controllable amplifiers to receive in parallel an analog electrical input representative of an audio signal and adapted to provide as output a first amplified signal at a first (or normal) level of gain g$_1$ and a second amplified signal at a second (or abnormal) level of gain g$_2$, the second level of gain g$_2$ being much greater than the first level of gain g$_1$;
    two filters connected to receive the first amplified signal and the second amplified signal, respectively, and operable to allow sampling thereof to eliminate aliasing;
    two analog-to-digital converters connected to receive the first amplified signal and the second amplified signal, after filtering thereof, and operable to convert the received signals respectively to first and second binary digital signals;
    two digital recorders connected to receive the digitized first and second binary digital signals and adapted to record the same and provide two outputs representing the first and second binary digital signals;
    a computer connected to receive said two outputs and adapted to evaluate the same, which computer provides two computer outputs;
    a further digital recorder connected to receive the two computer outputs and operable to record the same and to provide two recorder outputs;
    an interpolator connected to receive one recorder output of the further digital recorder;
    a multiplying digital-to-analog converter connected to receive the other output of the further digital recorder, which is in the form of a digital composite waveform; and
    another digital-to-analog converter connected to receive an output from the interpolator and operable to provide an analog gain control signal input to the multiplying digital-to-analog converter which multiplies the analog gain control signal input by said digital composite waveform to provide an output derived from the first (or normal) level signal during the loud or high amplitude portion of a said signal cycle and from the second (or abnormal) level during the audio low amplitude of said audio signal cycle.

2. Apparatus for extending the useful dynamic range of a digital-audio recording and reproduction system according to claim 1 in which the interpolator is operable to provide a smooth transition from one level to another level.

3. A method of extending the useful dynamic range of an audio reproduction system that is operable to provide an output audio signal in the form of a composite output audio signal that includes a high amplitude portion followed by a low amplitude portion with a transition or cross-fade portion therebetween, which method includes the steps of: providing an analog electrical representation of an audio signal; dividing the analog electrical representation into two analog signals and directing the two analog signals along two parallel electrical paths, each of the two analog signals having a high amplitude portion and a low amplitude portion; establishing or presenting one analog signal of the two analog signals at a normal amplitude level and amplifying the second analog signal of the two analog signals to an abnormal level; converting the one analog signal and the second analog signal to respective binary digital signals; processing the binary digital signals in a computer adapted to provide a first binary output containing a digitized composite waveform representation of the audio signal and a second binary output containing amplitude information with respect to the digitized composite waveform representation of the audio signal; providing an audio output signal that is derived from said digitized composite waveform, the audio output signal being a composite signal that includes an output derived from the one analog signal during the high amplitude portion and an output derived from the second analog signal during the low output portion of the audio signal, the transition or cross-fade portion being a blended signal that includes in part an output audio signal derived from the one analog signal and in part an output audio signal derived from the second analog signal; during the transition or cross-fade portion blending the contribution by the one analog signal and the second analog signal, the contribution of the one analog signal to the output audio signal being initially dominant and the contribution of the second analog signal being insignificant, the mixture of the one analog signal and the second analog signal being changed such that the contribution of the one analog signal to the output analog signal is decreased and the contribution of the second analog signal to the output audio signal is increased to provide a smooth transition between the high amplitude portion which is derived from said one analog signal and the low amplitude portion which is derived from the second analog signal; and during the transition or cross-fade portion of the signal modifying the amplification of the blended signal from a level that is based upon said normal amplitude level of the one analog signal toward a lower level which is the inverse of said abnormal level of the second analog signal.

4. Apparatus for extending the useful dynamic range of an audio reproduction system that is operable to provide an output audio signal in the form of a composite output audio signal that includes a high amplitude portion followed by a low amplitude portion with a cross-fade portion therebetween, which apparatus includes means for providing an analog electrical representation of an audio input signal; means for dividing the analog electrical representation into two analog signals and for directing the two analog signals along two parallel electrical paths, each of the two analog signals having a high amplitude portion and a low amplitude portion; means for presenting one analog signal of the two analog signals at a normal amplitude level;

means for amplifying the second analog signal of the two analog signals to an amplified abnormal level; means for converting the amplified one analog signal and the second analog signal to respective binary digital signals; computer means connected to receive the binary digital signals and adapted to process the binary digital signals to provide a first binary output containing spectral information with respect to the electrical representation of the audio signal and a second binary output containing amplitude information with respect to the electrical representation of the audio signal; means for providing an audio output signal that contains the spectral components, the audio output signal being a composite signal that includes an output derived from the one analog signal during the high amplitude portion and an output derived from the second analog signal during the low output portion of the audio signal, the cross-fade portion being a blended signal that includes in part an output audio signal derived from the one analog signal and in part an output audio signal derived from the one second analog signal; means for blending the contribution by the one analog signal and the second analog signal during said cross-fade portion to provide a blended signal, the contribution of the one analog signal to the blended signal being initially dominant and the contribution of the second analog signal being insignificant, the mixture of the one analog signal and the second analog signal being changed by said means for blending such that the contribution of the one analog signal to the output analog signal is decreased and the contribution of the second analog signal to the output audio signal is increased to provide a smooth transition between the high amplitude portion which is derived from the one analog signal and the low amplitude portion which is derived from the second analog signal; and interpolator means operable to control the amplitude level of the blended signal from an initial higher level of amplification to a lower level of amplification as the contribution to the blended signal changes from a condition in which the one analog signal dominates toward a condition in which the second analog signal dominates.

5. Apparatus for extending the useful dynamic range of an audio reproduction system with respect to an analog audio input, said apparatus being an audio reproduction system that is operable to provide an output audio signal that includes a high amplitude portion followed by a low amplitude portion with a cross-fade portion therebetween, said apparatus comprising means for providing a single analog electrical representation of an analog audio input, means which divides said analog electrical representation into two analog signals which are transmitted along two paths, each of the two analog signals having a high amplitude portion and a low amplitude portion, one of the two analog signals being presented at one gain setting $g_1$ and the second of the two analog signals being presented at another gain setting $g_2$ which is much higher than said one gain setting $g_1$; means for converting the two analog signals to two binary digital signals; computer means connected to receive the two binary digital signals and adapted to process the two binary digital signals to provide a first binary output in the form of a digitized composite waveform derived from the electrical representation of the audio signal and a second binary output containing gain information with respect to the electrical representation of the audio signal; and means for providing an audio output signal derived from said digitized composite waveform, said audio output signal being a composite signal that includes an output derived from the one analog signal during the high amplitude portion thereof and an output from the second analog signal during the low output portion thereof, with a cross-fade portion therebetween that is a blend of the said one analog signal and the said second analog signal.

6. Apparatus according to claim 5 that includes interpolator means connected to receive said second binary output and adapted to provide gain setting which is the gain $g_1$ during the high amplitude portion, which is $1/g_2$ during the low amplitude portion, which is initially the gain $g_1$ during the cross-fade portion and which is gradually changed during the cross-fade portion to the value $1/g_2$.

7. Apparatus according to claim 6 in which said one gain setting $g_1$ is about one and said another gain setting $g_2$ is about ten.

* * * * *